(12) United States Patent
Alvarez et al.

(10) Patent No.: US 9,636,714 B2
(45) Date of Patent: May 2, 2017

(54) COMPRESSION MOLDED ARTICLES EMPLOYING CIRCUMFERENTIAL SURFACES HAVING FRICTION-ENHANCING PATTERNS TO CONTACT SUBSTRATES DURING WET CHEMICAL PROCESSES

(71) Applicant: Applied Materials, Inc., Santa Clara, CA (US)

(72) Inventors: David P. Alvarez, San Jose, CA (US); Jim K. Atkinson, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 132 days.

(21) Appl. No.: 14/616,704

(22) Filed: Feb. 7, 2015

(65) Prior Publication Data

US 2016/0228923 A1    Aug. 11, 2016

(51) Int. Cl.
  *B08B 1/00*    (2006.01)
  *B08B 1/04*    (2006.01)
  *B08B 13/00*   (2006.01)
  *B29C 43/02*   (2006.01)
  *H01L 21/67*   (2006.01)
  *B29K 27/12*   (2006.01)
  *B29K 75/00*   (2006.01)
  *B29L 31/00*   (2006.01)

(52) U.S. Cl.
  CPC ............... *B08B 1/002* (2013.01); *B08B 1/04* (2013.01); *B08B 13/00* (2013.01); *B29C 43/021* (2013.01); *H01L 21/67046* (2013.01); *B29C 2043/025* (2013.01); *B29K 2027/12* (2013.01); *B29K 2075/00* (2013.01); *B29L 2031/7728* (2013.01)

(58) Field of Classification Search
  CPC  B08B 1/002; B08B 1/04; B08B 13/00; B24B 37/04; B29C 43/021; H01L 21/67046
  See application file for complete search history.

(56) References Cited

U.S. PATENT DOCUMENTS 6,003,185 A     12/1999  Saenz et al.
2006/0189465 A1  8/2006  Brown et al.
(Continued)

FOREIGN PATENT DOCUMENTS

JP    2013-506997 A    2/2013
KR    10-0376564 B1    3/2003

OTHER PUBLICATIONS

International Search Report dated Apr. 29, 2016 for Application No. PCT/US2016/013592.

*Primary Examiner* — Shay Karls
(74) *Attorney, Agent, or Firm* — Patterson + Sheridan, LLP

(57) ABSTRACT

Compression molded articles employing circumferential surfaces having friction-enhancing patterns to contact substrates during wet chemical processes are disclosed. An article such as an annular body may be formed by a compression molding technique. By including a patterned surface as part of an outer circumferential surface of the annular body, frictional contact between the annular body and the substrate may be enhanced as friction-reducing fluids associated with a wet chemical processes may be directed away from the desired friction contact area between the annular body and the substrate. In this manner, frictional contact may be enhanced and the substrate may be effectively positioned and moved during the wet chemical process to improve the effectively of the process.

20 Claims, 7 Drawing Sheets

(56) References Cited

U.S. PATENT DOCUMENTS

2009/0217953 A1   9/2009  Chen et al.
2012/0258280 A1  10/2012  Jackson et al.
2014/0310895 A1  10/2014  Chen

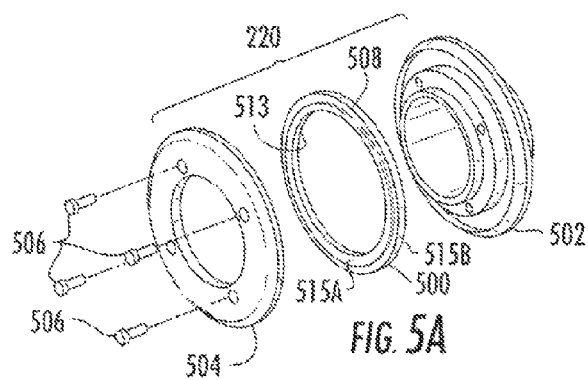
FIG. 5A
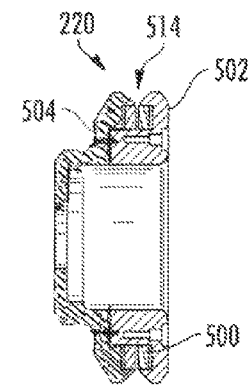
FIG. 5B
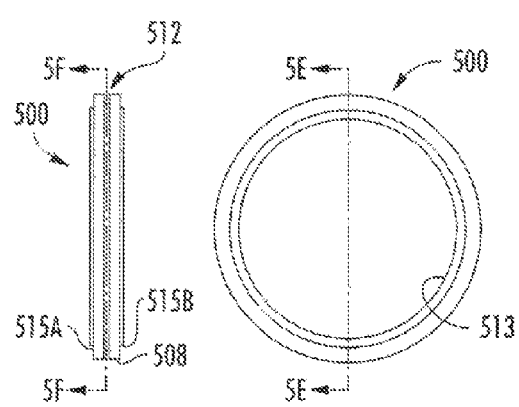
FIG. 5C
FIG. 5D
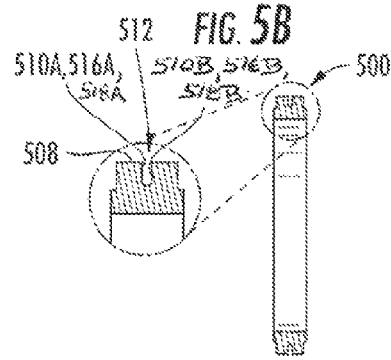
FIG. 5E
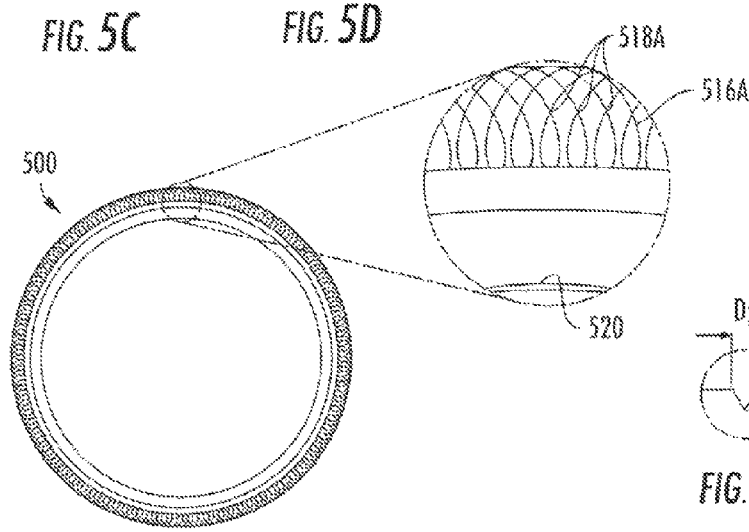
FIG. 5F
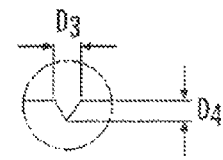
FIG. 5G

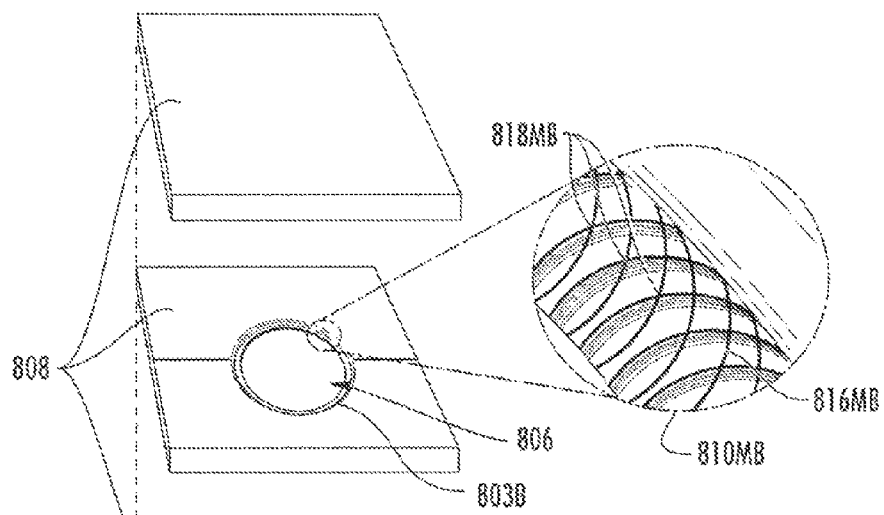
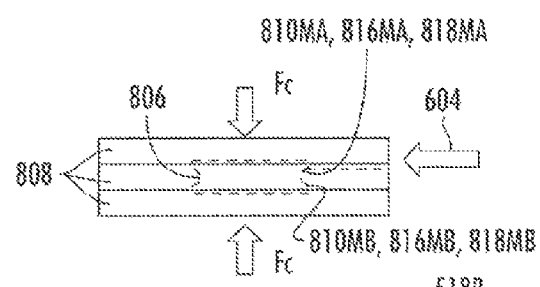
FIG. 8A
FIG. 8B
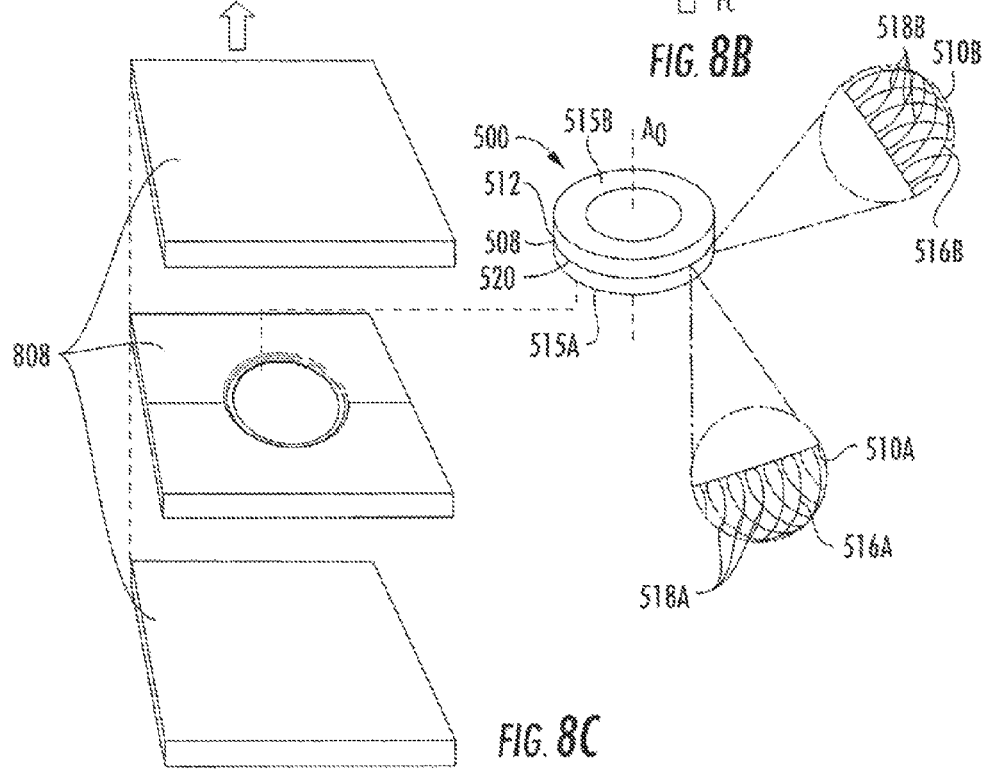
FIG. 8C

COMPRESSION MOLDED ARTICLES EMPLOYING CIRCUMFERENTIAL SURFACES HAVING FRICTION-ENHANCING PATTERNS TO CONTACT SUBSTRATES DURING WET CHEMICAL PROCESSES

BACKGROUND

Field

Embodiments of the present disclosure generally relate to semiconductor device manufacturing, and in particular to substrate cleaning in chemical mechanical polishing.

Description of the Related Art

Chemical mechanical polishing (CMP), also known as chemical mechanical planarization, is a process typically used to fabricate integrated circuits upon a silicon wafer (or "substrate"). A CMP polishing process may remove unwanted topography and materials from a partially processed substrate to produce a planar surface upon the substrate for subsequent processing. The CMP polishing process may utilize abrasives and/or a chemically-active polishing solution (sometimes called a slurry) on one or more rotating polishing pads pressed against a surface of the substrate. A cleaning process may occur subsequent to the CMP polishing process to remove residual polishing solution and/or particulates created by polishing and remaining on the substrate. This removal may prevent defects from forming on the substrate which may be scratched or otherwise damaged from the residual polishing solution and/or particulates.

The cleaning process may include scrubbing front and back surfaces of the substrate with scrubber brushes provided with a cleaning solution. The scrubber brushes may be forced against the substrate as the substrate rotates to achieve adequate cleaning efficiency and thoroughness. The substrate is rotated by substrate rollers which receive a side edge of the substrate and impart a torque using frictional contact to the side edge from a drive system that powers the substrate rollers. Monitoring the rotation of the substrate during cleaning is accomplished by a sensor wheel which is configured to rotate passively while in frictional contact with the substrate during cleaning. Maintaining effective frictional contact between the substrate and the substrate rollers, as well as between the substrate and the sensor wheel ensures effective cleaning of the substrate and consistent cleaning between substrates. Sometimes frictional contact is compromised when the substrate rollers and the sensor wheel change over time and are exposed to the cleaning solution. New approaches are needed to maintain frictional contact, so that the substrates may be reliably rotated and moved during cleaning so that defects related to inadequate removal of particulates and/or inadequate removal or polishing solution can be avoided.

SUMMARY

Embodiments disclosed herein include compression molded articles employing circumferential surfaces having friction-enhancing patterns to contact substrates during wet chemical processes. An article such as an annular body may be formed by a compression molding technique. By including a patterned surface as part of an outer circumferential surface of the annular body, frictional contact between the annular body and the substrate may be enhanced as friction-reducing fluids associated with a wet chemical processes may be directed away from the desired friction contact area between the annular body and the substrate. In this manner, frictional contact may be enhanced and the substrate may be effectively positioned and moved during the wet chemical process to improve the effectively of the process.

In one embodiment, an article to be in rotatable communication with a circular substrate during substrate cleaning is disclosed. The article includes an annular body comprising a compression mold seam and having a center axis. The annular body includes a first sidewall, a second sidewall opposite the first sidewall, and an outer circumferential surface connecting the first and the second sidewall. The outer circumferential surface includes at least one patterned surface comprising at least one groove, and the at least one groove has a depth in a range from five (5) microns to fifty (50) microns. In this manner, the annular body may be used to establish a more effective contact with the substrate to improve positioning of the substrate during wet chemical processes such as substrate cleaning after chemical mechanical polishing (CMP).

In another embodiment, a method for providing an article in rotatable communication with a circular substrate during substrate cleaning is disclosed. The method includes disposing a material into an inner volume of a compression mold, wherein the compression mold includes at least one mold surface defining the inner volume. The method also includes forming, with the at least one mold surface and the material, an annular body having a center axis. The annular body includes a first sidewall, a second sidewall opposite the first sidewall, and an outer circumferential surface connecting the first sidewall the second sidewall. The outer circumferential surface includes at least one patterned surface comprising at least one groove. The method also includes hardening or setting the material to create the article. In this manner, a more effective frictional contact may be facilitated between the annular body and the substrate during wet chemical processes, for example substrate cleaning, to reduce an occurrence of substrate defects.

In another embodiment, a substrate cleaning module to support chemical mechanical polishing of a substrate is disclosed. The module may include an enclosure containing cleaning solution. The module may also include a motorized brush to clean a surface of the substrate with the cleaning solution. The module may also include a sensor wheel to support the substrate during cleaning. The sensor wheel is configured to rotate passively with the substrate and the sensor wheel is coupled to a sensor to monitor rotational speed. The sensor wheel includes a first annular body comprising a compression mold seam and having a center axis comprising at least one first patterned surface having at least one groove. The at least one groove has a depth in a range from five (5) microns to fifty (50) microns. The at least one first patterned surface abuts against the substrate during cleaning of the substrate. The module also includes a plurality of substrate rollers configured to receive a side edge of the substrate and to impart a torque to the side edge. Each of the plurality of substrate rollers includes a second annular body comprising a compression mold seam and having a center axis. The second annular body includes a second outer circumferential surface. The second outer circumferential surface includes at least one second patterned surface comprising at least one second groove, and the at least one second groove has a depth in a range from five (5) microns to fifty (50) microns. The at least one second patterned surface abuts against the substrate during cleaning of the substrate. In this manner, the substrate may be more effectively cleaned.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 5A and 5B are a top perspective exploded view and a side sectional view, respectively, of one of the substrate rollers of FIG. 2, wherein each of the substrate rollers includes a hub, a flange, and an annular body;

FIGS. 5C through 5E are a side view, a front view, and a side sectional view, respectively, of the annular body of FIG. 5A;

FIG. 5F is a right side sectional view of the annular body of FIG. 5A, and the left side sectional view is identical thereto;

FIG. 5G is a sectional view through a cross section of one of at least one groove of FIG. 5F;

FIG. 8A is a top perspective schematic view of a compression mold depicting an inner volume therein;

FIG. 8B is a side schematic view of the compression mold of FIG. 8A with material being disposed within the inner volume; and FIG. 8C is a top perspective schematic view of the annular body formed by the compression mold of FIG. 8A.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Whenever possible, like reference numbers will be used to refer to like components or parts.

Embodiments disclosed herein include compression molded articles employing circumferential surfaces having friction-enhancing patterns to contact substrates during wet chemical processes. An article such as an annular body may be formed by a compression molding technique. By including a patterned surface as part of an outer circumferential surface of the annular body, frictional contact between the annular body and the substrate may be enhanced as friction-reducing fluids associated with a wet chemical processes may be directed away from the desired friction contact area between the annular body and the substrate. In this manner, frictional contact may be enhanced and the substrate may be effectively positioned and moved during the wet chemical process to improve the effectively of the process.

Figure 1:
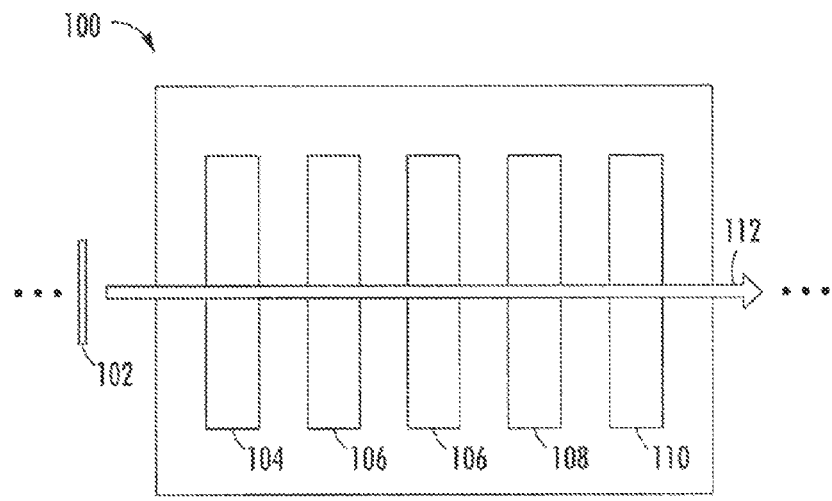
FIG. 1 is a schematic top view of an exemplary cleaning module.

In this regard, FIG. 1 is a schematic top view of an exemplary cleaning module 100. The cleaning module 100 may be part of a chemical mechanical polishing (CMP) tool and may receive a partially-processed substrate 102 from a CMP polishing station of the CMP tool via one or more robots/transfer mechanisms (not shown). The substrate 102 may be a semiconductor wafer containing silicon, or another workpiece. The cleaning module 100 may include a megasonic cleaner unit 104, two brush box units 106, a jet cleaner unit 108, and a dryer unit 110. The cleaning module 100 may have other suitable numbers of units 104, 106, 108 and/or 110, and/or may additionally or alternatively have other suitable units than those depicted. A transfer device (not shown) may move the substrate 102 through the cleaning module 100, as indicated by arrow 112. The megasonic cleaner unit 104 may be configured to perform a cleaning process using megasonic energy. The two brush box units 106 may each be configured to perform a cleaning process using mechanical contact via a scrubbing motion (described in more detail below in connection with FIGS. 2-3B). The jet cleaner unit 108 may be configured to perform a cleaning process using pressurized liquid. Also, the dryer unit 110 may be configured to perform a drying process to quickly dry the substrate 102 after cleaning to remove cleaning residue and to prevent streaking and spotting caused by evaporation. After processing in the dryer unit 110, the substrate 102 may be returned to a CMP polishing station within the CMP tool or transported to another substrate processing tool. The cleaning module 100 may be, for example, part of, a Reflexion® GT™ CMP System, supplied by Applied Materials, Inc. of Santa Clara, Calif.

Figure 2:
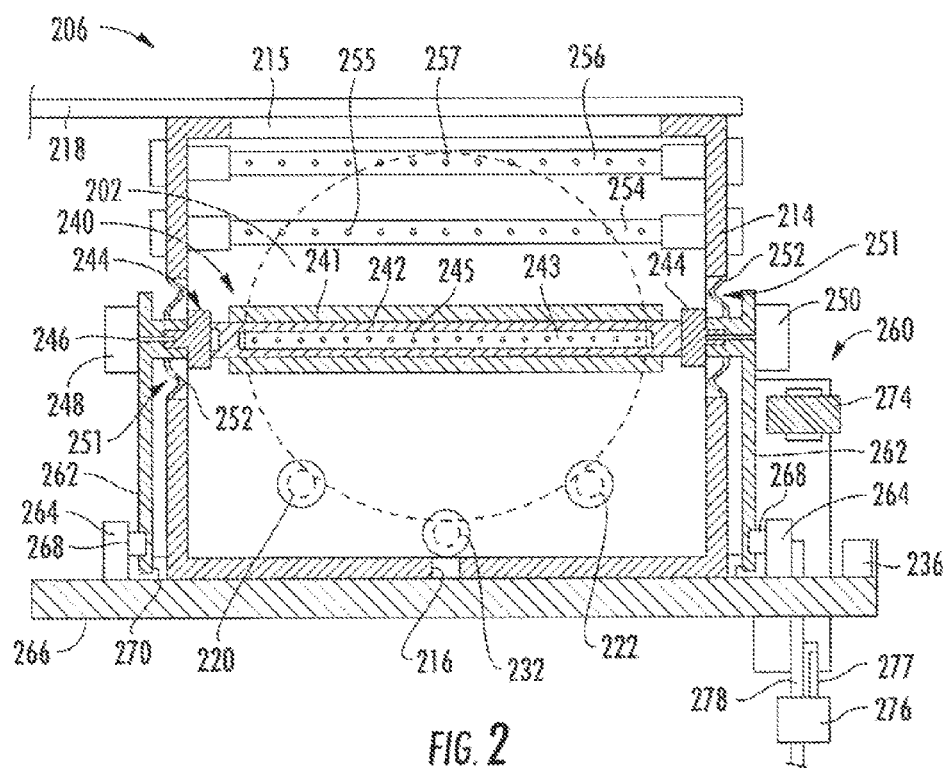
FIG. 2 is a schematic cross-sectional view of a brush box unit of the cleaning module of FIG. 1 depicting a sensor wheel and substrate rollers in frictional contact with a substrate during cleaning, which is an example of a wet chemical process.
Figure 3A:
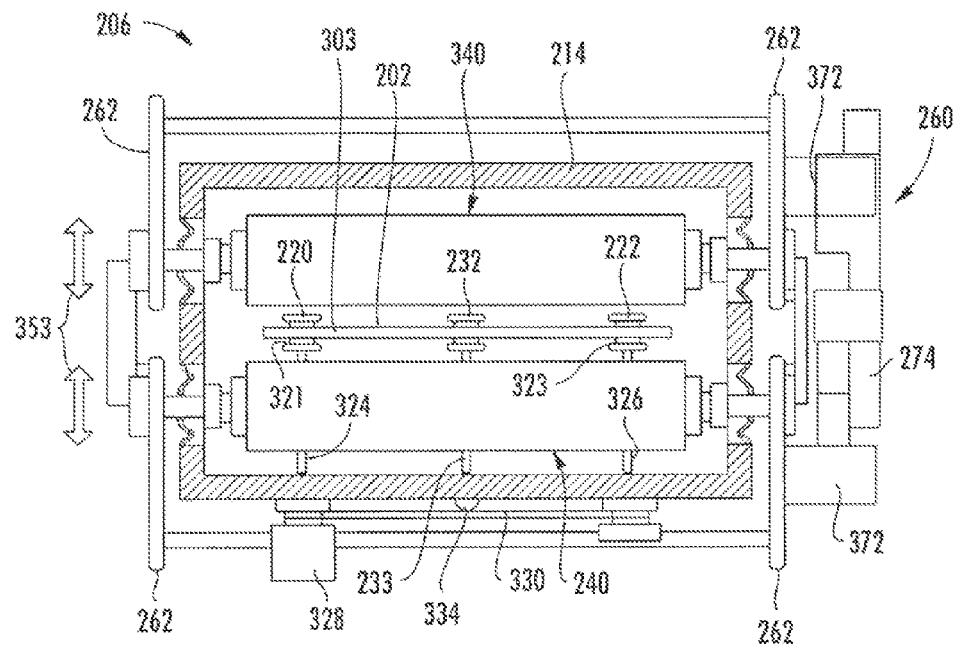
FIGS. 3A and 3B are schematic top views of the brush box unit of FIG. 2 with scrubber brush assemblies in respective retracted and cleaning positions.
Figure 3B:
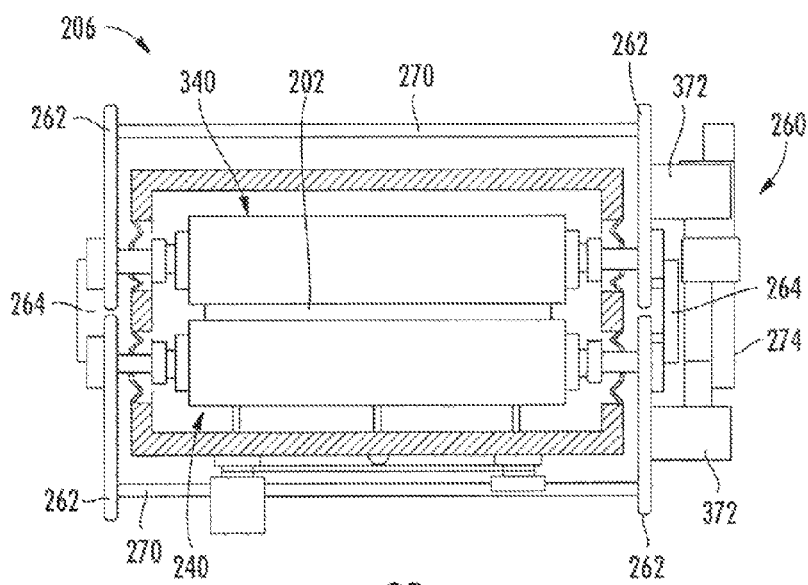

FIG. 2 is a schematic cross-sectional view of a brush box unit 206 of the cleaning module 100 of FIG. 1. The brush box unit 206 includes substrate rollers 220, 222 and a sensor wheel 232 in frictional contact with a substrate 202 during cleaning. FIGS. 3A and 3B are schematic top views of the brush box unit 206 of FIG. 2 with scrubber brush assemblies 240, 340 in respective retracted and cleaning positions. The brush box unit 206 may be configured to receive and clean the substrate 202 in a vertical position using the scrubber brush assemblies 240, 340. In some embodiments, the brush box unit 206 may include an enclosure 214 having a top opening 215 configured to allow the substrate 202 to enter and exit there through a substrate handler (not shown). The enclosure 214 may be configured to contain a cleaning solution therein and may include a drain 216. The brush box unit 206 may also include a sliding cover 218 configured to cover the top opening 215 to prevent the cleaning solution from splashing out and outside particles from entering the enclosure 214.

The brush box unit 206 includes two substrate rollers 220, 222 positioned in a lower portion of the enclosure 214. The substrate rollers 220, 222 may each respectively have recessed areas 321, 323 (see FIG. 3A) configured to receive a side edge 303 of the substrate 202. The substrate rollers 220, 222 may be coupled to respective driving axles 324, 326. The driving axles 324, 326 may be coupled to a driving mechanism 328, which may be a motor, configured to rotate the substrate rollers 220, 222. The driving axle 326 may be coupled to the driving mechanism 328 via a belt assembly 330. In alternative embodiments, the substrate rollers 220, 222 may each be rotated by different driving mechanisms. During a cleaning process, the substrate rollers 220, 222 may rotate at substantially a same rate and cause the substrate 202 to rotate via frictional contact which transfers torque from the substrate rollers 220, 222 to the substrate 202. In this manner, the substrate 202 may be induced to move during the cleaning process.

With continued reference to FIG. 2, the brush box unit 206 also includes the sensor wheel 232 that may be positioned in a lower portion of the enclosure 214. The substrate 202 may rest on the sensor wheel 232. The sensor wheel 232 may be configured to rotate passively with the substrate 202 and to transfer the rotational speed of the substrate 202 to a rotation sensor 334 (see FIG. 3A). The rotation sensor 334 may be coupled to a system controller 236 to monitor the rotational speed as a quality metric for the cleaning process. The sensor wheel 232 may have other suitable configurations and positions. In this manner, the rotation of the substrate 202 may be monitored to ensure consistent cleaning between substrates 202.

The brush box unit 206 may also include the scrubber brush assemblies 240, 340 (see FIGS. 3A, 3B) positioned above substrate rollers 220 and 222 in enclosure 214. The scrubber brush assemblies 240, 340 may also be positioned to extend along opposite sides of the substrate 202 and may be configured to movably contact the substrate 202 during cleaning. Each of the scrubber brush assemblies 240, 340 may include a cylindrical scrubber brush 241 configured to contact the substrate 202. Each cylindrical scrubber brush 241 may have surface cleaning features protruding therefrom (not shown) and may be mounted on a mandrel assembly 242. Each end of the mandrel assembly 242 may be attached to a mounting shaft 244. One of more of the mounting shafts 244 may be coupled to a driving shaft 246 of a motor 248, which may be configured to rotate the cylindrical scrubber brush 241 at a selected speed. In some embodiments, the motor 248 may be configured to rotate cylindrical scrubber brush 241 at a rotational speed in a range from fifty (50) RPM to seven-hundred (700) RPM. The other mounting shaft 244 may be connected to a cleaning solution supply 250, which may be fluidly coupled to an inner channel 243 of the mandrel assembly 242. A plurality of openings 245 formed in the mandrel assembly 242 may be configured to provide a cleaning solution received from cleaning solution supply 250 to the cylindrical scrubber brush 241. In this manner, the cleaning solution may be distributed as desired for effective cleaning of the substrate 202.

The scrubber brush assemblies 240, 340 may be installed in the brush box unit 206 via openings 251 formed in the enclosure 214. A membrane seal 252 may be coupled around each end of the scrubber brush assemblies 240, 340 to seal respective openings 251. The membrane seals 252 enable the scrubber brush assemblies 240, 340 to move laterally (as indicated by arrows 353 in FIG. 3A) within openings 251.

In some embodiments, the brush box unit 206 may also include a pair of cleaning solution spray bars 254 (only one is shown in FIG. 2) positioned on opposite sides of the enclosure 214 and above the scrubber brush assemblies 240, 340. Other embodiments may have more or less than two cleaning solution spray bars 254. The cleaning solution spray bars 254 may be configured to spray the cleaning solution via a plurality of nozzles 255 toward each side of the substrate 202 during the cleaning of the substrate 202. The nozzles 255 may be evenly distributed along the cleaning solution spray bar 254. Other embodiments may have other suitable numbers and configurations of the nozzles 255.

In some embodiments, the brush box unit 206 may further include a pair of the water spray bars 256 (only one is shown in FIG. 2) positioned on opposite sides of the enclosure 214 and above the cleaning solution spray bars 254. Other embodiments may have more or less than two of the water spray bars 256. The water spray bars 256 may be configured to spray de-ionized water or a chemical via a plurality of spraying nozzles 257 toward each side of the substrate 202 as the substrate 202 is being transferred into and/or out of the enclosure 214. The spraying nozzles 257 may be evenly distributed along the water spray bar 256. Other embodiments may have other suitable numbers and configurations of the spraying nozzles 257.

The brush box unit 206 may also include a positioning assembly 260 configured to move the scrubber brush assemblies 240, 340 relative to the substrate 202. For example, FIG. 3A illustrates scrubber brush assemblies 240, 340 in a retracted position (i.e., moved away from substrate 202), while FIG. 3B illustrates scrubber brush assemblies 240, 340 in a cleaning position (i.e., moved towards and in contact with substrate 202).

Each scrubber brush assembly 240, 340 may extend through membrane seal 252 and may be coupled to two pivoting plates 262 on opposite ends. The pivoting plates 262 are movably coupled to a mounting block 264 that may be secured to a supporting frame 266. Each of the pivoting plates 262 may be pivotable about a pivoting joint 268. The pivoting plates 262 coupled to each of scrubber brush assemblies 240, 340 may be coupled to each other via a synchronizing bar 270 configured to synchronize the movement of the two pivoting plates 262.

As shown in FIGS. 3A-3B, each pivoting plate 262 on one side of brush box unit 206 (i.e., the right side as shown) may be coupled to an actuating arm 372. A control assembly 274 may be coupled between the two actuating arms 372 in accordance with one or more embodiments. The control assembly 274 may be configured, in some embodiments, to linearly extend and retract to move actuating arms 372 relative to each other. A sliding block 276 may also be coupled between the two actuating arms 372. Each actuating arm 372 may be connected to sliding block 276 via a link 277. A vertical track 278 may be coupled to mounting block 264. The sliding block 276 may be configured to slide vertically along vertical track 278.

During a cleaning process, the control assembly 274 may extend or retract to move actuating arms 372 relative to each other. The motion of the actuating arms 372 may be restrained by links 277 and the sliding block 276 to result in substantially symmetric motion. The motion of actuating arms 372 may cause pivoting plates 262 to pivot about pivoting joint 268, which may cause scrubber brush assemblies 240, 340 to move in a symmetric manner. At the same time, synchronizing bars 270 may pivot about pivoting joints 268 to transfer motion of pivoting plates 262 from one side of enclosure 214 to the other side and, thus, synchronize the motion of pivoting plates 262 on the opposite ends of scrubber brush assemblies 240, 340.

Figures 4A, 4B:
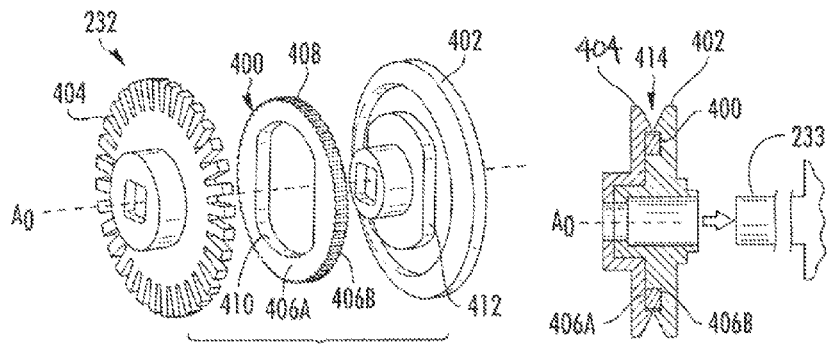
FIGS. 4A and 4B are an exploded top perspective view and a side sectional view, respectively, of the sensor wheel of FIG. 2, wherein the sensor wheel includes a hub, a flange, and an annular body.

Now that details of the cleaning module 100 have been disclosed, details of the sensor wheel 232 are now discussed. In this regard, FIGS. 4A and 4B are an exploded top perspective view and a side sectional view, respectively, of the sensor wheel 232 of FIG. 2. The sensor wheel 232 may include an annular body 400, a hub 402, and a flange 404. The annular body 400 includes a first sidewall 406A, a second sidewall 406B opposite the first sidewall 406A, and an outer circumferential surface 408 connecting the first sidewall 406A and the second sidewall 406B. The annular body 400 may also include an inner surface 410 to receive a coupling surface 412 of the hub 402. The annular body 400 includes an outer circumferential surface 408 which supports the substrate 202 (FIG. 2) and forms a frictional contact with the side edge 303 of the substrate 202. The flange 404 of the sensor wheel 232 may also be coupled to the hub 402. Collectively, the flange 404 and the hub 402 may be shaped to form a converging circumferential channel 414 to urge the substrate 202 towards to the annular body 400 in order to form the frictional contact. The annular body 400 may comprise a material which includes components that are mechanically strong and resistant to chemical degradation, for example, at least one of a perfluoroelastomer and a polyurethane. In this manner, the sensor wheel 232 may be configured to rotate passively with the substrate 202 and transfer the rotational rate of the substrate 202 to the rotation sensor 334 (FIG. 3A).

Figures 4C, 4D:
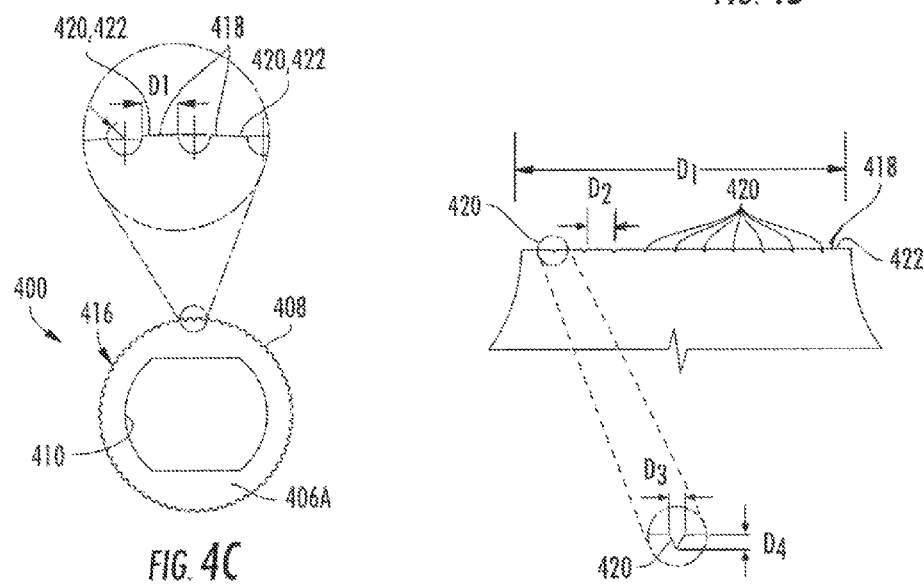
FIG. 4C is a front view of the annular body of the sensor wheel of FIG. 4A depicting teeth projecting radially to apexes as part of an outer circumferential surface.
FIG. 4D is an enlarged view of one of the apexes of FIG. 4C depicting at least one groove of at least one patterned surface.

FIG. 4C is a front view of the annular body 400 of the sensor wheel 232 of FIG. 4A depicting teeth 416 projecting radially to apexes 418 as part of the outer circumferential surface 408. Each of the apex 418 may be a circumferential length D1 in a range from 0.5 millimeters to twenty millimeters. The teeth 416 help direct the cleaning fluid away from the apexes 418 to improve frictional contact with the substrate 202.

Figure 4E:
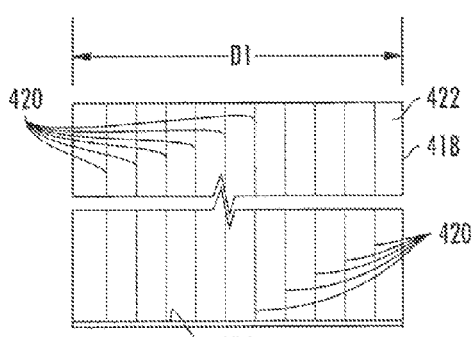
FIG. 4E is a top view of the apex of FIG. 4D.

Further, FIG. 4D is an enlarged view of one of the apexes 418 of FIG. 4C depicting at least one groove 420 of at least one patterned surface 422 and FIG. 4E is a top view of the apex 418 of FIG. 4D. The grooves 420 further improve friction with the substrate 202 by enabling the apexes 418 to flex and deform to better facilitate contact with the substrate 202. Also, the grooves 420 can also help direct the cooling fluid away from the frictional contact area between the substrate 202 and the annular body 400 to further improve friction. The grooves 420 may have a depth D4 from five (5) microns to fifty (50) microns and have a width D3 from five (5) microns to fifty (50) microns. In this manner, the grooves 420 may help improve frictional contact between the substrate 202 and the annular body 400 to facilitate more consistent cleaning between substrates 202.

It is noted that the annular body 400 includes a compression mold seam 424 (FIG. 4E). The compression mold seam 424 includes an irregular surface area resulting from components of a compression mold (discussed later) coming together to cause an accumulation of material (sometimes called "flash"). The compression mold seam 424 may be reduced by use of material removal operations. The compression mold seam 424 may occur in one or more locations of the annular body 400 depending upon the compression mold used.

FIGS. 5A and 5B are a top perspective exploded view and a side sectional view of the substrate roller 220 of FIG. 2. The substrate roller 222 would be depicted similarly. The substrate roller 220 includes an annular body 500, a hub 502, and a flange 504 attachable to the hub 502 with fasteners 506. The hub 502 is configured to receive torque from the driving axle 324 (FIG. 3A). The hub 502 is also configured to transfer this torque to the annular body 500 using for example, an inner surface 513 of the annular body 500. The torque may then transferred from the annular body 500 to the side edge 303 of the substrate 202 using frictional contact at the outer circumferential surface 508 of the annular body 500. The annular body 400 may comprise a material which includes components that are mechanically strong and resistant to chemical degradation, for example, at least one of a perfluoroelastomer and a polyurethane. In this manner, the substrate roller conveys torque to the substrate 202 in a wet process environment which may include caustic chemicals.

FIGS. 5C through 5E are a side view, a front view, and a side sectional view, respectively, of the annular body 500 of FIG. 5A which include features to facilitate the transfer of torque to the substrate 202. The annular body 500 includes a first patterned surface 510A facing a second patterned surface 510B in a circumferentially-located depression 512 of the outer circumferential surface 508. The hub 502 and the flange 504 are shaped to form a converging circumferential channel 514 when coupled to the annular body 500 which urges the side edge 303 of the substrate 202 within the circumferentially-located depression 512. The circumferentially-located depression 512 is sized relative to the side edge 303 of the substrate 202 to enable the first and the second patterned surfaces 510A, 510B form abutments with the side edge 303 of the substrate 202. In order to improve a torque-transferring capability of the frictional contacts, the first and the second patterned surfaces 510A, 510B may include at least one grooves 516A, 516B, respectively.

In this regard, FIG. 5F is a right side sectional view of the annular body 500 of FIG. 5A depicting at least one groove 516A in the first patterned surface 510A of the annular body 500. The groove 516A may also include intersections 518A where the groove 516A crosses over itself and thereby facilitates more efficient routes for the cleaning fluid to be directed away from the frictional contact area. It is noted that the left side sectional view (not shown) would depict at least one groove 516B in the second patterned surface 510B of the annular body 500, intersections 518B, and the left side sectional view would be identical to FIG. 5F. The groove 516A forms a cyclical pattern occurring with a frequency range from 30 cycles per inch to 150 cycles per inch along the outer circumference of the annular body 500. In this manner, the groove 516A may more easily direct cleaning fluid away from the frictional contact area between the annular body 500 and the substrate 202. The resulting abutment with the cleaning fluid directed away can form a more robust frictional contact between the substrate 202 and the first and the second patterned surfaces 510A, 510B. In this manner, torque may be more efficiently transferred from the first and the second patterned surfaces 510A, 510B of the annular body 500 to the substrate 202 and thereby the potential for defects may be reduced as the substrate 202 may be less likely to slip from the substrate rollers 220, 222 during cleaning or other wet chemical processes.

The grooves 516A, 516B may have various dimensions to more easily direct cleaning fluid away from the abutment. FIG. 5G is a sectional view of the cross section of the at least one groove of FIG. 5F. The grooves 516A, 516B may have a depth D4 from five (5) microns to fifty (50) microns and have a width D3 from five (5) microns to fifty (50) microns. In this manner, the grooves 516A, 516B may help improve frictional contact between the substrate 202 and the annular body 500.

It is noted that the annular body 500 includes a compression mold seam 520 (FIG. 5F). The compression mold seam 520 includes an irregular surface area resulting from components of a compression mold (discussed later) coming together to cause an accumulation of material (sometimes called "flash"). The compression mold seam 520 may be reduced by use of material removal operations. The compression mold seam 520 may occur in one or more locations of the annular body 500 depending upon the compression mold used.

Figure 6:
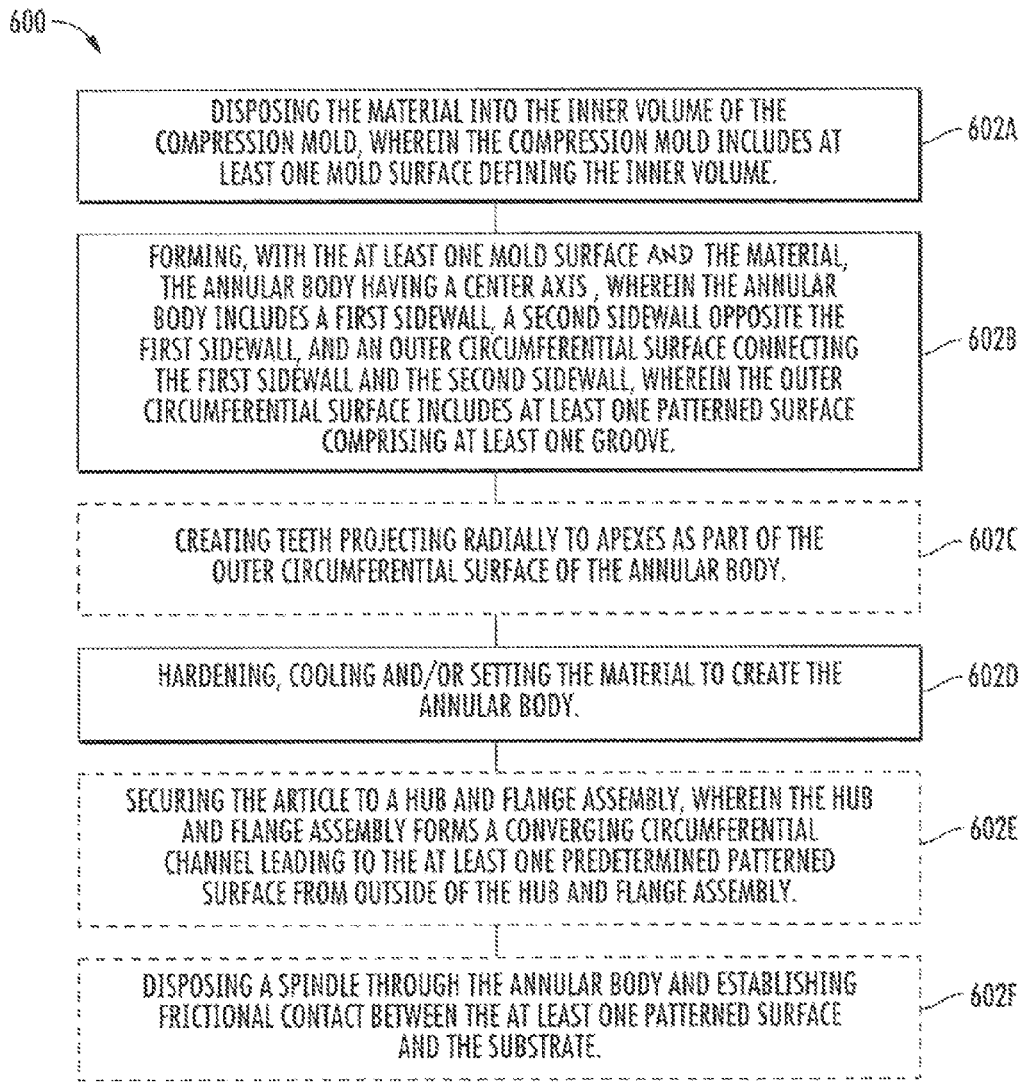
FIG. 6 depicts is a flowchart of an exemplary method for providing an article in rotatable communication with a substrate during substrate cleaning.

Articles have been introduced, for example the sensor wheel 232 and the substrate rollers 220, 222, which provide rotatable communication with the substrate 202 during cleaning or other wet chemical processes. Now an exemplary process of providing these articles is provided. FIG. 6 depicts a flowchart of an exemplary method 600 for providing an article in rotatable communication with a substrate during substrate cleaning, for example, with the cleaning module 100 of FIG. 1. The method 600 will be discussed using the terminology discussed above.

Figure 7A:
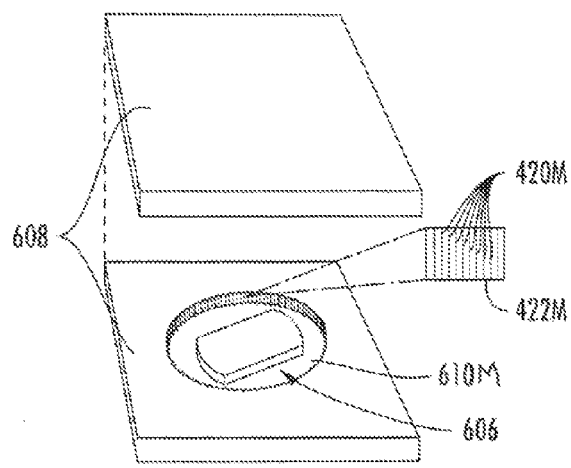
FIG. 7A is a top perspective schematic view of an exemplary compression mold depicting an inner volume therein.
Figure 7B:
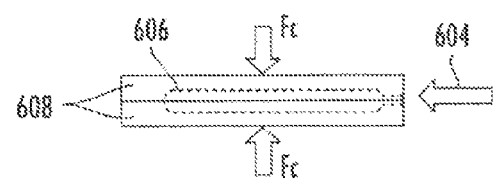
FIG. 7B is a side schematic view of the compression mold of FIG. 7A with material being disposed within the inner volume.

In this regard, the method 600 includes disposing a material 604 into an inner volume 606 of a compression mold 608 (operation 602A of FIG. 6). By way of example, FIG. 7A is a top perspective schematic view of one embodiment of the compression mold 608 including at least one mold surface 610M defining the inner volume 606. The mold surface 610M may include a patterned mold shape 422M complementary with the patterned surface 422. The patterned mold shape 422M may include at least one raised mold features 420M complementary with the at least one groove 420. FIG. 7B is a side schematic view of the compression mold 608 of FIG. 7A with the material 604 being disposed within the inner volume 606 of the compression mold 608 as a compression force FC is applied. In this manner, the material 604 may be disposed in a position to be shaped by the compression mold 608.

The method 600 also includes forming, with the at least one mold surface 610M and the material 604, the annular body 400 having the center axis A0 (operation 602B of FIG. 6). The annular body 400 includes the first sidewall 406A, the second sidewall 406B opposite the first sidewall 406A, and the outer circumferential surface 408 connecting the first sidewall 406A and the second sidewall 406B. The outer circumferential surface 408 of the annular body 400 includes the at least one patterned surface 422 comprising the at least one groove 420. The method 600 may also include creating the teeth 416 projecting radially to apexes 418 as part of the outer circumferential surface 408 of the annular body 400 (operation 602C of FIG. 6). The teeth 416 may be created efficiently as part of the compression molding process as depicted in FIG. 7A. Alternatively, the teeth 416 may be created using a cutting or material removal process (not shown).

Figure 7C:
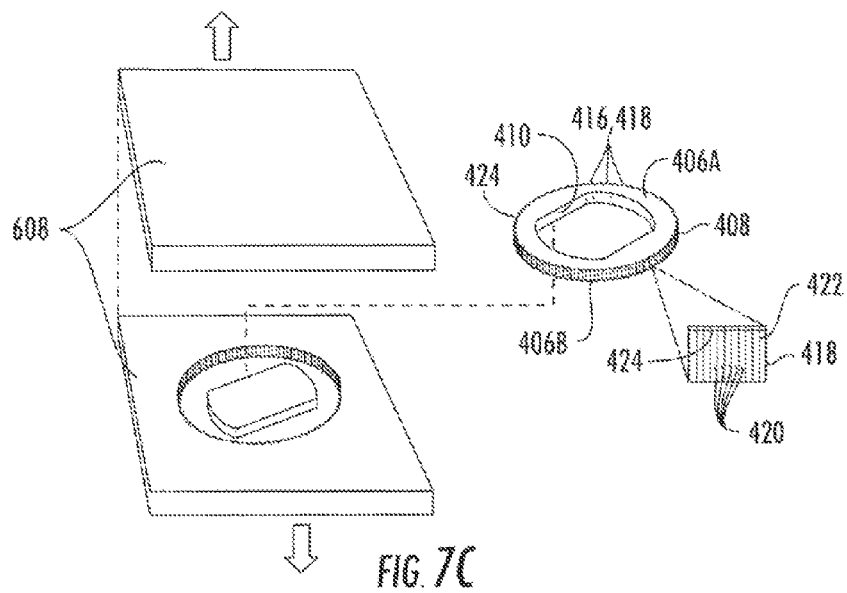
FIG. 7C is a top perspective schematic view of the annular body formed by the compression mold of FIG. 7A.

The method 600 also includes hardening, cooling and/or setting the material 604 to create the article, for example, the annular body 400 (operation 602D of FIG. 6). The hardening, cooling and/or setting the material 604 may occur within the compression mold 608 for a designated time period and may be dependent upon the material 604 and the dimensions used for the article. FIG. 7C is a top perspective schematic view of the annular body 400, representing the article, formed by the compression mold 608 of FIG. 7A.

The method 600 may also include securing the article, for example the annular body 400, to the hub 402 and flange 404 assembly (operation 602E of FIG. 6). The hub 402 and the flange 404 when coupled to the annular body 400 may form the converging circumferential channel 414 (FIG. 4B) leading to the at least one predetermined patterned surface 422 from outside of the hub 402 and flange 404 assembly. In this manner, the side edge 303 of the substrate 202 may be efficiently positioned to form an abutment and fictional contact with the patterned surface 422 of the annular body 400 of the sensor wheel 232.

The method 600 may also include disposing a spindle 233 (FIG. 3A) through the sensor wheel 232 (article) and establishing frictional contact between the at least one patterned surface 422 and the substrate 202 (operation 602F of FIG. 6).

FIGS. 8A through 8C are depictions of the method 600 as may be applied to the substrate roller 220. FIGS. 8A through 8C directed to the substrate roller 220 are similar to FIGS. 7A through 7C directed to the sensor wheel 232, and so mainly the differences will be discussed in the interest of clarity and conciseness. The method 600 includes disposing the material 604 into an inner volume 806 of a compression mold 808 (operation 602A of FIG. 6). By way of example, FIG. 8A is a top perspective schematic view of one embodiment of the compression mold 808 including at least one mold surface 803M defining the inner volume 806. The mold surface 803M may include patterned shapes 810MA, 810MB complementary with the patterned surfaces 510A, 510B, respectively. The patterned shapes 810MA, 810MB may include respectively at least one raised mold features 816MA, 816MB complementary with the grooves 516A, 516B and intersections 818MA, 818MB. FIG. 8B is a side schematic view of the compression mold 808 of FIG. 8A with the material 604 being disposed within the inner volume 806 of the compression mold 808 as a compression force FC is applied. In this manner, the material 604 may be disposed in a position to be shaped by the compression mold 808.

The method 600 also includes forming, with the at least one mold surface 803M and the material 604, the annular body 500 having the center axis A0 (operation 602B of FIG. 6). The annular body 500 includes the first sidewall 515A, the second sidewall 515B opposite the first sidewall 515A, and the outer circumferential surface 508 connecting the first sidewall 515A and the second sidewall 515B. The annular body 500 may also include the inner surface 513 to connect the first sidewall 515A and the second sidewall 515B and may be configured to receive torque from one or more of the driving axles 324, 326. The outer circumferential surface 508 of the annular body 500 includes the at least one patterned surface 510A, 510B within the circumferential-located depression 512 and respectively comprising the at least one groove 516A, 516B. The patterned surfaces 510A, 510B may facilitate a more reliable frictional contact with the substrate 202 by directing fluid away from the frictional contact. In this manner, the annular body 500 may be formed to effectively transfer torque to the substrate 202 in wet processing environments.

The method 600 also includes hardening, cooling and/or setting the material 604 to create the article, for example, the annular body 500 (operation 602D of FIG. 6). The hardening, cooling and/or setting the material 604 may occur within the compression mold 608 for a designated time period and may be dependent upon the material 604 selected and dimensions used for the article. FIG. 8C is a top perspective schematic view of the annular body 500, representing the article, formed by the compression mold 808 of FIG. 8A. In this manner, the annular body 500 may include the patterned surfaces 510A, 510B to direct fluid, for example cleaning fluid, away from the frictional contact between the annular body 500 and the substrate 202, so that torque may be more reliably transmitted between the annular body 500 and the substrate 202.

To facilitate understanding, identical reference numerals have been used, where possible, to designate identical elements that are common to the figures. It is contemplated that elements and features of one embodiment may be beneficially incorporated in other embodiments without further recitation.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present disclosure, other and further embodiments of the disclosure may be devised without departing from the basic scope thereof, and the scope thereof is determined by the claims that follow.

What is claimed is:

1. An article to be in rotatable communication with a substrate during substrate cleaning, comprising:
an annular body comprising a first sidewall, a second sidewall opposite the first sidewall, and an outer circumferential surface connecting the first and the second sidewall, wherein the outer circumferential surface includes at least one patterned surface comprising at least one groove, and the at least one groove forms a cyclical pattern occurring with a frequency range from 30 cycles per inch to 150 cycles per inch along the outer circumference.

2. The article of claim 1, wherein the annular body has an outer diameter in a range between twenty (20) to one-hundred fifty (150) millimeters.

3. The article of claim 1, wherein the at least one patterned surface includes a first patterned surface facing a second patterned surface in a circumferentially-located depression of the outer circumferential surface.

4. The article of claim 1, wherein the at least one groove includes a plurality of grooves spaced apart along the outer circumferential surface.

5. The article of claim 1, further comprising a plurality of teeth projecting radially to apexes as part of the outer circumferential surface.

6. The article of claim 1, wherein the at least one groove has a depth in a range from five (5) microns to fifty (50) microns.

7. An article to be in rotatable communication with a substrate during substrate cleaning, comprising:
an annular body comprising a first sidewall, a second sidewall opposite the first sidewall, and an outer circumferential surface connecting the first and the second sidewall, wherein the outer circumferential surface includes at least one patterned surface comprising at least one groove, and the at least one groove includes intersections where the at least one groove crosses over itself.

8. The article of claim 7, wherein the annular body has an outer diameter in a range between twenty (20) to one-hundred fifty (150) millimeters.

9. The article of claim 7, wherein the at least one patterned surface includes a first patterned surface facing a second patterned surface in a circumferentially-located depression of the outer circumferential surface.

10. The article of claim 7, wherein the at least one groove includes a plurality of grooves spaced apart along the outer circumferential surface.

11. The article of claim 7, further comprising a plurality of teeth projecting radially to apexes as part of the outer circumferential surface.

12. The article of claim 7, wherein the at least one groove has a depth in a range from five (5) microns to fifty (50) microns.

13. A substrate cleaning module to support chemical mechanical polishing of a substrate, comprising:
an enclosure containing cleaning solution;
a motorized brush to clean a surface of the substrate with the cleaning solution;
a plurality of substrate rollers configured to receive a side edge of the substrate and to impart a torque to the side edge, wherein each of the plurality of substrate rollers includes a first annular body comprising a first sidewall, a second sidewall opposite the first sidewall, and an outer circumferential surface connecting the first and the second sidewall, wherein the outer circumferential surface includes at least one first patterned surface comprising at least one first groove, the at least one first groove forms a cyclical pattern occurring with a frequency range from 30 cycles per inch to 150 cycles per inch along the outer circumference, and the at least one first patterned surface abuts against the substrate during cleaning of the substrate.

14. The substrate cleaning module of claim 13, wherein the first annular body has an outer diameter in a range between twenty (20) to one-hundred fifty (150) millimeters.

15. The substrate cleaning module of claim 13, wherein the at least one first groove includes intersections where the at least one first groove crosses over itself.

16. The substrate cleaning module of claim 13, wherein the at least one first patterned surface includes a first surface facing a second surface in a circumferentially-located depression of the outer circumferential surface.

17. The substrate cleaning module of claim 13, wherein the at least one first groove includes a plurality of grooves spaced apart along the outer circumferential surface.

18. The substrate cleaning module of claim 13, further comprising a plurality of teeth projecting radially to apexes as part of the outer circumferential surface.

19. The substrate cleaning module of claim 13, further comprising:
   a sensor wheel to support the substrate during cleaning, the sensor wheel configured to rotate passively with the substrate and the sensor wheel coupled to a sensor to monitor rotational speed, wherein the sensor wheel includes a second annular body comprising at least one second patterned surface having at least one second groove, wherein the at least one second patterned surface abuts against the substrate during cleaning of the substrate.

20. The substrate cleaning module of claim 13, wherein the at least one first groove has a depth in a range from five (5) microns to fifty (50) microns.

\* \* \* \* \*